(12) United States Patent
Lewis

(10) Patent No.: US 7,837,517 B2
(45) Date of Patent: Nov. 23, 2010

(54) TEST TERMINAL CONNECTOR

(76) Inventor: Blaine Lewis, 158 Wilcox Cir., Jonesborough, TN (US) 37699

( * ) Notice: Subject to any disclaimer, the term of this patent is extended or adjusted under 35 U.S.C. 154(b) by 0 days.

(21) Appl. No.: 12/254,195

(22) Filed: Oct. 20, 2008

(65) Prior Publication Data

US 2009/0068903 A1    Mar. 12, 2009

Related U.S. Application Data

(63) Continuation of application No. 11/900,327, filed on Sep. 11, 2007, now Pat. No. 7,438,603.

(51) Int. Cl.
*H01R 9/22* (2006.01)
(52) U.S. Cl. ...................................... 439/709
(58) Field of Classification Search .................. 439/709, 439/710, 711, 712, 713, 715, 717, 718, 719, 439/720, 721, 722
See application file for complete search history.

(56) References Cited

U.S. PATENT DOCUMENTS

| 4,934,968 | A | * | 6/1990 | Davis et al. | 439/886 |
| 5,197,903 | A | * | 3/1993 | Casey et al. | 439/564 |
| 2005/0227547 | A1 | * | 10/2005 | Hunziker | 439/709 |

* cited by examiner

*Primary Examiner*—Ross N Gushi
(74) *Attorney, Agent, or Firm*—Carter, DeLuca, Farrell & Schmidt, LLP

(57) ABSTRACT

A test terminal connector for use in selectively interconnecting electrical leads of a railway circuit is provided and includes a mounting block; a first and a second terminal supported in and extending from the mounting block; a test strap supported on and extending between the first and second terminal; at least one fastening element selectively connectable to the first and second terminals; and a dielectric spacer disposed between the test strap and an electrical lead of the railway circuit. The test strap is constructed of an electrically conductive material, and each fastening element is constructed of the same material as the test strap.

22 Claims, 5 Drawing Sheets

TEST TERMINAL CONNECTOR

CROSS-REFERENCE TO RELATED APPLICATION

This application is a continuation of U.S. application Ser. No. 11/900,327, filed Sep. 11, 2007, which application is incorporated by reference herein.

BACKGROUND

1. Technical Field

The present disclosure relates to connectors and, more particularly, to test terminal connectors for use in railway systems, railway bungalows and the like.

2. Background of Related Art

Railroad signals relays, test terminal connectors or terminal blocks have been used for many years. Typically, terminal blocks are installed in bungalows or field cases alongside the tracks. As these enclosures are neither heated nor air-conditioned, the terminal blocks housed therein may be subject to the effects of ambient conditions, such as moisture, which may result in corrosion of the signal relay or the like.

Terminal blocks typically include a terminal strap extending between and selectively secured to a pair of mounting or terminal bolts by way of suitable binding or clamp nuts. Typically, the test strap is made of copper that is coated in or is plated with nickel; and at least one of the terminal bolts, in direct physical contact with the test strap, is made of brass and may or may not be coated with gold. Over time, as the terminal bolts are tightened and loosened, the abrasion or sliding contact between the dissimilar materials of the terminal bolt against the surface of the test strap may result in the creation of a high resistance contact therebetween. In other words, the terminal bolt may wear through the nickel coating of the test strap, exposing the inner copper material thereof. As such, the terminal block may cause the circuit to which it is connected to intermit (i.e., opening and closing of the circuit) or fail, thus creating an unwanted situation.

The situation is exacerbated due to the possible exposure of the terminal block to moisture which may corrode or oxidize the exposed copper of the test strap.

Accordingly, a need exists for improved terminal blocks for us with railway circuits and the like.

SUMMARY

The present disclosure relates to test terminal connectors for use in railway systems, railway bungalows and the like.

According to an aspect of the present disclosure, a test terminal connector for use in selectively interconnecting electrical leads of a railway circuit is provided. The test terminal connector includes a mounting block; a first and a second terminal supported in and extending from the mounting block; a test strap supported on and extending between the first and second terminal; at least one fastening element selectively connectable to the first and second terminals; and a dielectric spacer disposed between the test strap and an electrical lead of the railway circuit. The test strap is constructed of an electrically conductive material, and each fastening element is constructed of the same material as the test strap.

The test strap and each fastening element may be at least coated with at least one of nickel and a nickel alloy.

Each terminal may be a mounting bolt and each fastening element is a nut configured for selective threaded engagement with a respective mounting bolt.

The test strap may include a first end connectable to the first terminal; a second end connectable to the second terminal; and a goose-neck portion interconnecting the first end and the second end. Each end of the test strap may define an aperture configured to receive a respective terminal therein.

The dielectric spacer may include an aperture formed therein for receiving one of the terminals, and a flange extending therefrom and being configured for positioning within the aperture of one of the first and second ends of the test strap. A height of the flange of the dielectric spacer may be at least one of equal to and less than a thickness of the test strap.

In an embodiment, the at least one fastener supported on the terminal that supports the dielectric spacer may contact the test strap when the at least one fastener is at a lowest most position on the terminal.

The dielectric spacer may include a pair of arms extending therefrom and configured to extend at least partially around the test strap. In use, the arms maintain the dielectric spacer supported on the test strap.

The test terminal connector may further include a spacer disposed below one of the first end and the second end of the test strap to maintain the first and second ends of the test strap substantially parallel to a surface of the mounting block.

The at least one fastener may define a surface that contacts the test strap and that extends over the aperture formed in the respective end of the test strap.

According to another aspect of the present disclosure, a further test terminal connector for use in selectively interconnecting electrical leads of a railway circuit is provided. The test terminal connector includes a mounting block fabricated from a dielectric material; a first and a second mounting bolt supported in and extending from the mounting block; and a test strap supported on and extending between the first and second mounting bolts, wherein the test strap is constructed of an electrically conductive material. The test strap includes a first end connectable to the first mounting bolt; a second end connectable to the second mounting bolt; and a goose-neck portion interconnecting the first end and the second end. The test terminal connector further includes at least one binding nut selectively connectable to the first and second mounting bolts, wherein each binding nut is constructed of the same material as the test strap and defines planar upper and lower surfaces; and a dielectric spacer disposed between the test strap and an electrical lead of the railway circuit.

The test strap and each binding nut may be at least coated with at least one of nickel and a nickel alloy.

Each end of the test strap may define an aperture configured to receive a respective mounting bolt therein.

The dielectric spacer may include an aperture formed therein for receiving one of the mounting bolts, and a flange extending therefrom and being configured for positioning within the aperture of one of the first and second ends of the test strap.

A height of the flange of the dielectric spacer may be at least one of equal to and less than a thickness of the test strap.

The at least one fastener may be supported on the mounting bolt that supports the dielectric spacer and may contact the test strap when the at least one fastener is at a lowest most position on the mounting bolt.

The dielectric spacer may include a pair of arms extending therefrom and configured to extend at least partially around the test strap. In use, the arms maintain the dielectric spacer supported on the test strap.

The test terminal connector further includes a spacer nut disposed below one of the first end and the second end of the test strap to maintain the first and second ends of the test strap substantially parallel to a surface of the mounting block.

The at least one fastener may define a surface that contacts the test strap and may extend over the aperture formed in the respective end of the test strap.

DETAILED DESCRIPTION OF EMBODIMENTS

Figure 1:
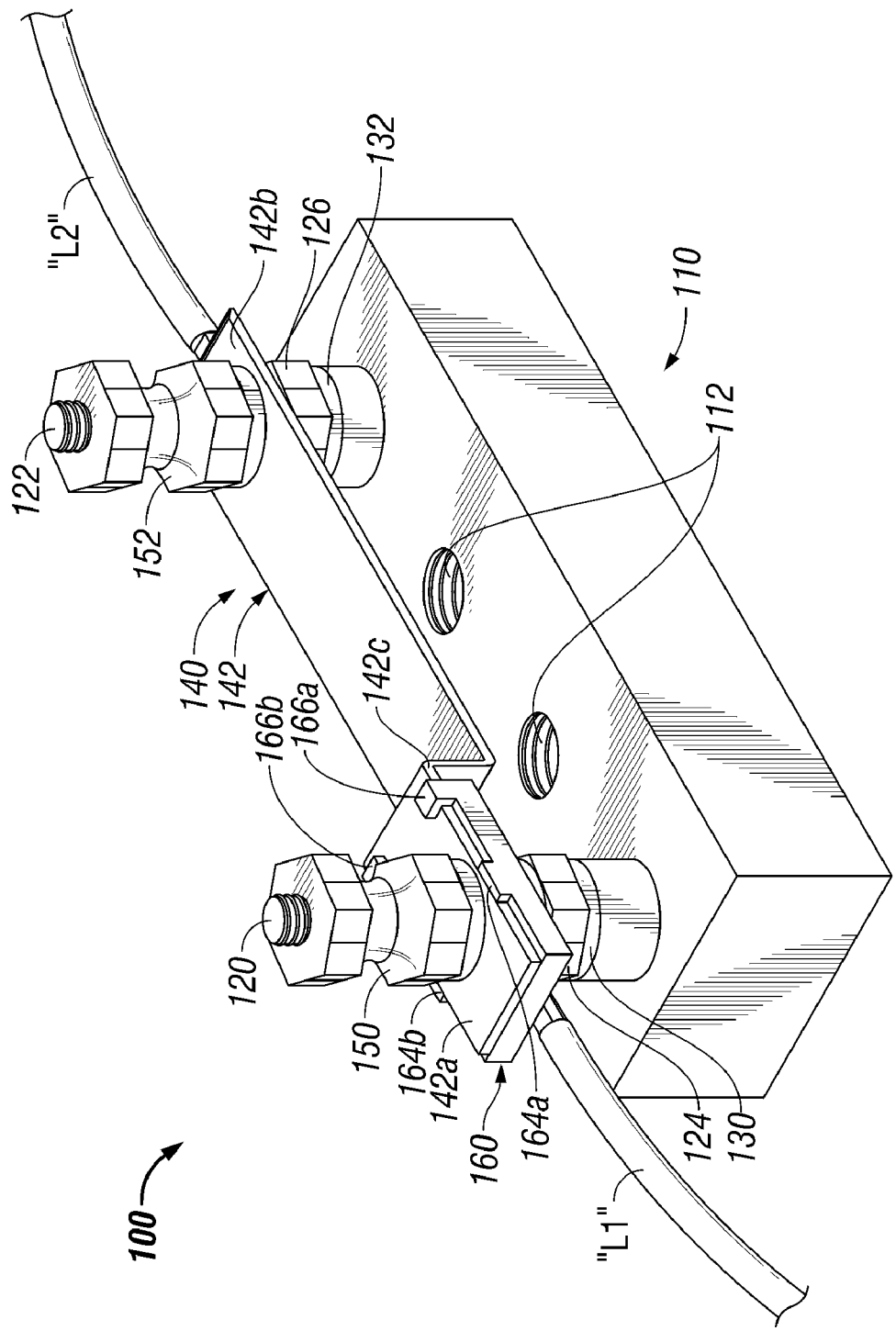
FIG. 1 is a perspective view of a test terminal connector according to an embodiment of the present disclosure.
Figure 2:
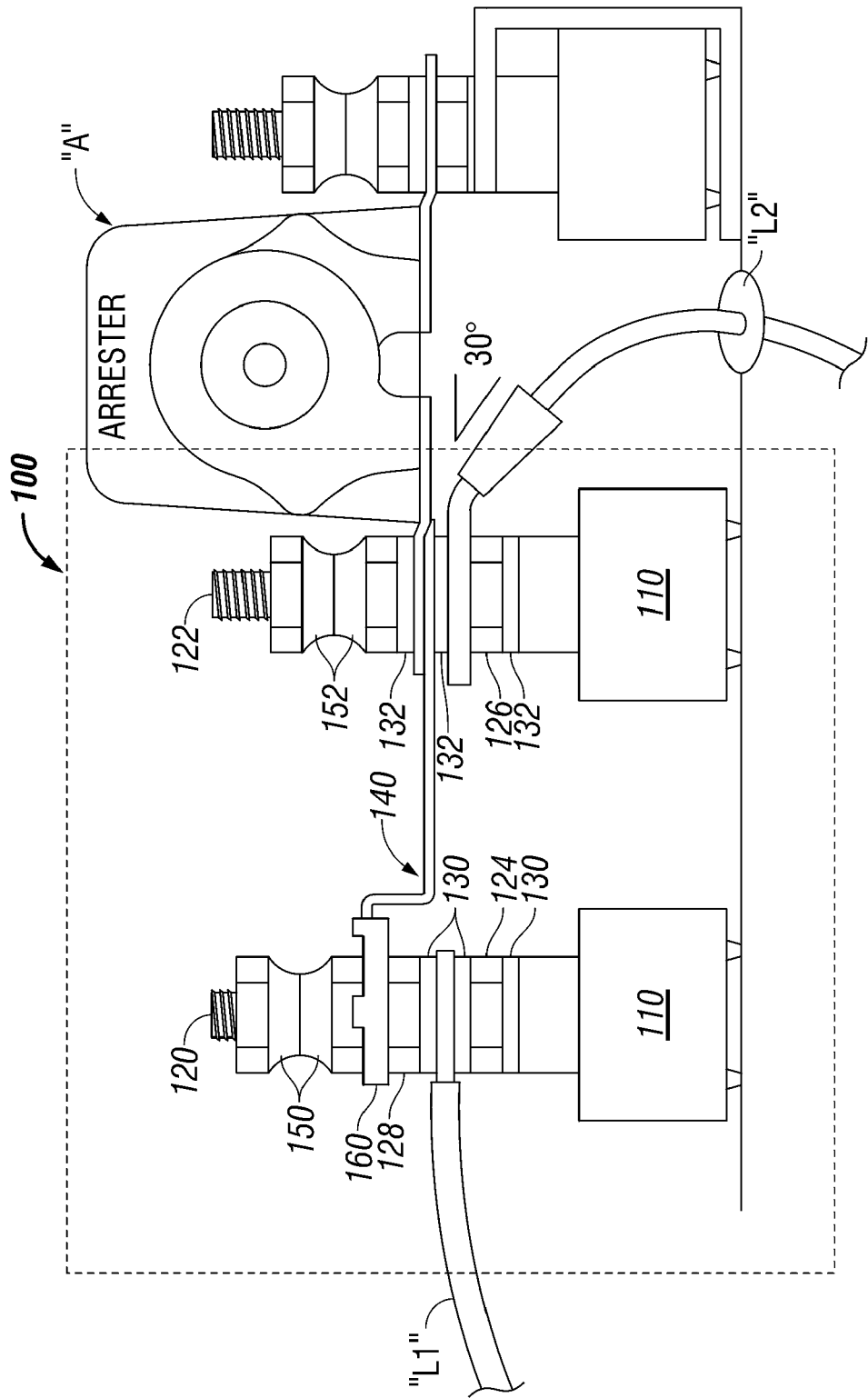
FIG. 2 is a side elevational view of the test terminal connector of FIG. 1.
Figure 3:
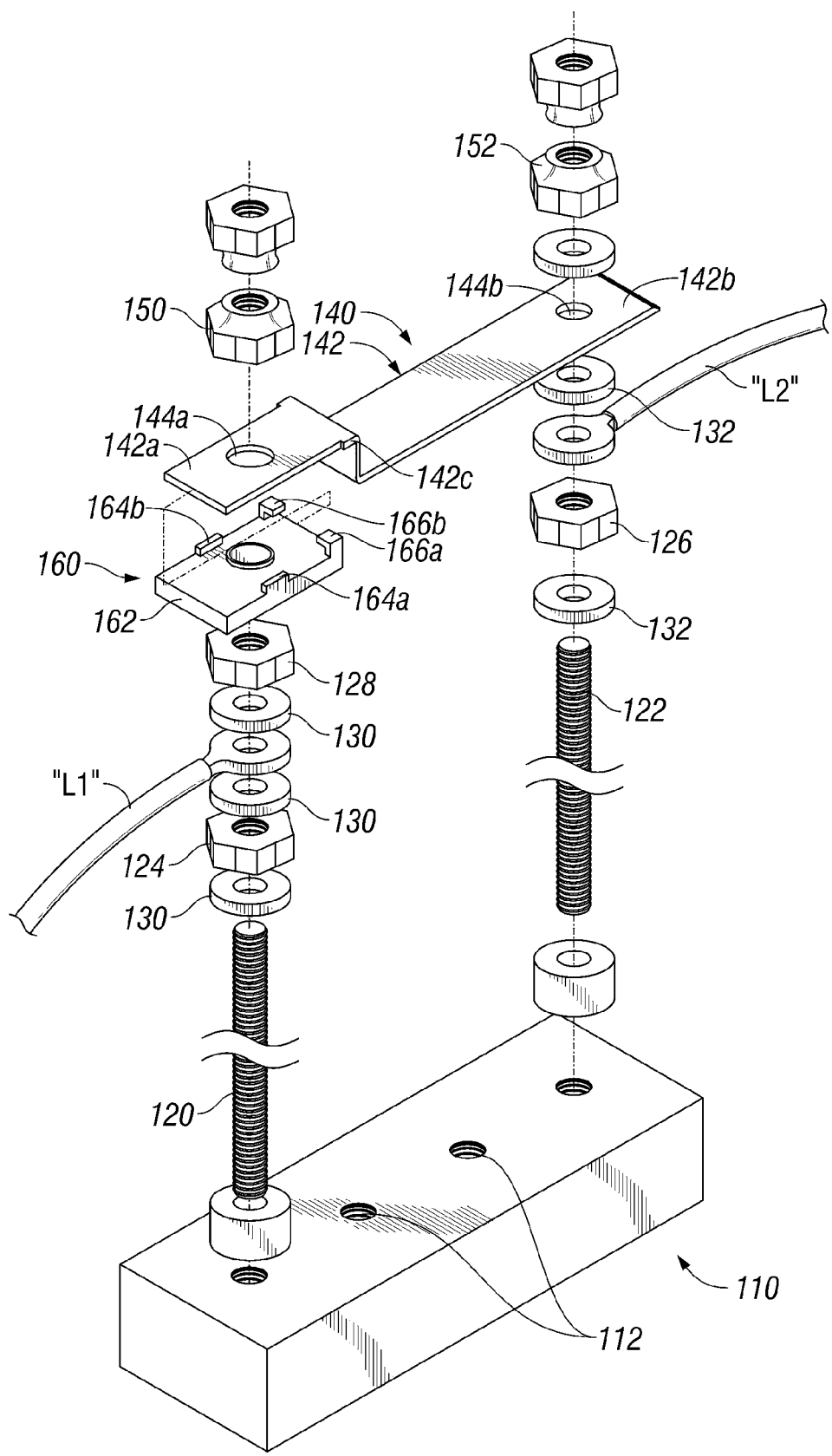
FIG. 3 is an exploded perspective view of the test terminal connector of FIGS. 1 and 2.
Figure 4:
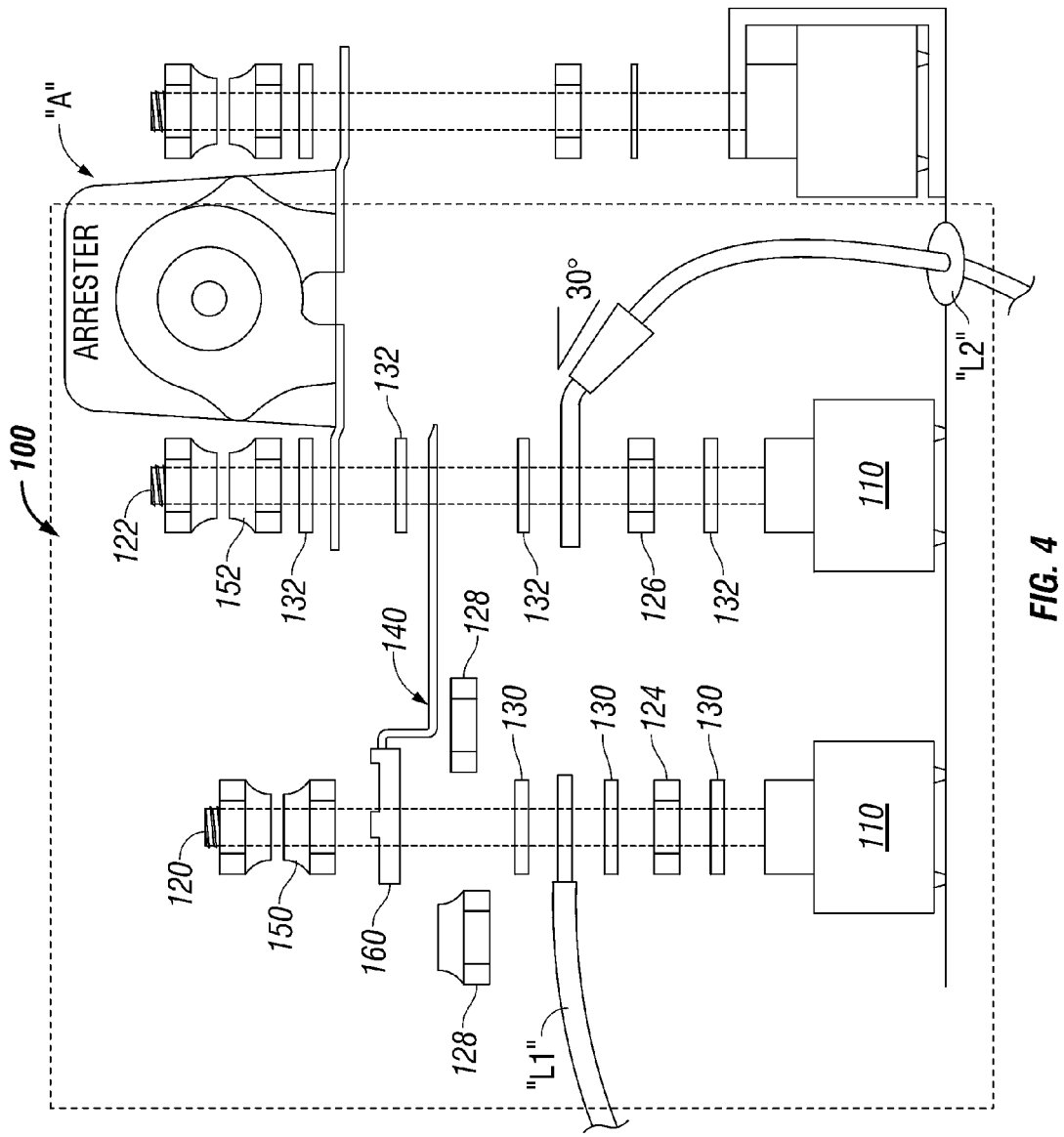
FIG. 4 is an exploded, side elevational view of the test terminal connector of FIGS. 1-3.

Referring to FIGS. 1-6, a test terminal connector, in accordance with an embodiment of the present disclosure, is generally designated as 100. As seen in FIGS. 1-4, test terminal connector 100 includes a mounting or supporting block 110 fabricated from a suitable dielectric or non-conductive material. Mounting block 110 includes structure 112, for example, in the form of apertures or the like, formed therein for securing terminal connector 100 to a suitable substrate or mounting surface (not shown).

Terminal connector 100 further includes a pair of spaced apart terminals or mounting bolts 120, 122 mounted or supported in mounting block 110 and extending therefrom. Mounting bolts 120, 122 may extend from a common side of mounting block 110 as shown, or may extend from any suitable side of mounting block 110. Mounting bolts 120, 122 may be fabricated from any suitable conductive material, non-conductive material or combination thereof (e.g., a non-conductive core coated or plated with a conductive material or vice-versa). A suitable material used to coat or plate mounting bolts 120, 122 may include and is not limited to nickel and nickel alloys. Alternatively, mounting bolts 120, 122 may be made entirely of nickel and/or nickel alloys.

Mounting bolts 120, 122 may each be fixedly or releasably secured to mounting block 110. For example, mounting bolts 120, 122 may be threading received in mounting block 110 in such a manner so as to permit removal of mounting bolts 120, 122 therefrom, or in such a manner so as to inhibit removal of mounting bolts 120, 122 therefrom. For example, lock nuts 124, 126 or the like may be used to secure mounting bolts 120, 122 to mounting block 110.

Suitable washers 130, 132 may be disposed beneath lock nuts 124, 126. Terminal connector 100 further includes at least one other washer 130 (two shown) supported on mounting bolt 120, and at least one other washer 132 (two shown) supported on mounting bolt 122. Washers 130, 132 may be fabricated from any suitable conductive material, non-conductive material or combination thereof (e.g., a non-conductive core coated or plated with a conductive material or vice-versa). A suitable material used to coat or plate washers 130, 132 may include and is not limited to nickel and nickel alloys. Alternatively, washers 130, 132 may be made entirely of nickel and/or nickel alloys.

Terminal connector 100 further includes a test strap 140 supported on and extending between mounting bolts 120, 122. Test strap 140 includes a body portion 142 defining a first aperture 144a formed near a first end 142a thereof and a second aperture 144b formed near a second end 142b thereof. Test strap 140 includes a goose-neck portion 142c between first end 142a and second end 142b of body portion 142 thereby positioning first end 142a of body portion 142 in a plane which is spaced apart from a plane of second end 142b of body portion 142.

In this manner, when test strap 140 is supported on mounting bolts 120, 122, in a first orientation, first end 142a of body portion 142 is located relatively further away from mounting block 110 as compared to second end 142b of body portion 142. Alternatively, if test strap 140 is supported on mounting bolts 120, 122, in a second orientation, second end 142b of body portion 142 is located relatively further away from mounting block 110 as compared to first end 142a of body portion 142.

Test strap 140 may be fabricated from any suitable conductive material, non-conductive material or combination thereof (e.g., a non-conductive core coated or plated with a conductive material or vice-versa). A suitable material used to coat or plate test strap 140 may include and is not limited to nickel and/or nickel alloys. Alternatively, test strap 140 may be made entirely of nickel and/or nickel alloys.

A spacer nut or the like 128 may be supported on the mounting bolt 120, 122 that supports the end 142a, 142b of body portion 142 of test strap 140 that is spaced relatively further from the mounting block 110. For example, as seen in the figures, spacer nut 128 is provided on mounting bolt 120 and at least partially compensates for the dimensions of goose-neck portion 142c of body portion 142 of test strap 140.

Terminal connector 100 further includes at least one fastening element, in the form of a binding or clamp nut 150 (two shown) operatively engaged/engageable with or supported on mounting bolt 120, and at least one binding or clamp nut 152 (two shown) operatively engaged/engageable with or supported on mounting bolt 122. Binding or clamp nuts 150, 152 may be fabricated from any suitable conductive material, non-conductive material or combination thereof (e.g., a non-conductive core coated or plated with a conductive material or vice-versa). A suitable material used to coat or plate binding or clamp nuts 150, 152 may include and is not limited to nickel and nickel alloys. Alternatively, binding or clamp nuts 150, 152 may be made entirely of nickel and/or nickel alloys.

Binding or clamp nuts 150, 152 may include standard RSA-type nuts, AREMA (American Railway Engineering and Maintenance-of-Way Association) 14.1.11 nuts or the like. Binding or clamp nuts 150, 152 may include planar upper and lower surface which contact the surfaces of body portion 142 of test strap 140.

Terminal connector 100 further includes a spacer 160 selectively or fixedly supported on first end 142a of body portion 142 of test strap 140 so as to be interposed between first end 142a of body portion 142 of test strap 140 and spacer nut 138. Spacer 160 is fabricated from any suitable dielectric, insulative or non-conductive material, including and not limited to polycarbonate, engineered plastic, Delrin® (polyoxymethylene (POM), acetal resin, polytrioxane and polyformaldehyde) commercially available from E.I. du Pont de Nemours and Company, Wilmington Del., and the like. Spacer 160 should be manufactured from a material which may be used as a metal substitute, is lightweight, has low-friction, has good wear-resistance and is capable of operating in temperatures in excess of 90° C. (approx 200° F.).

Figure 5:
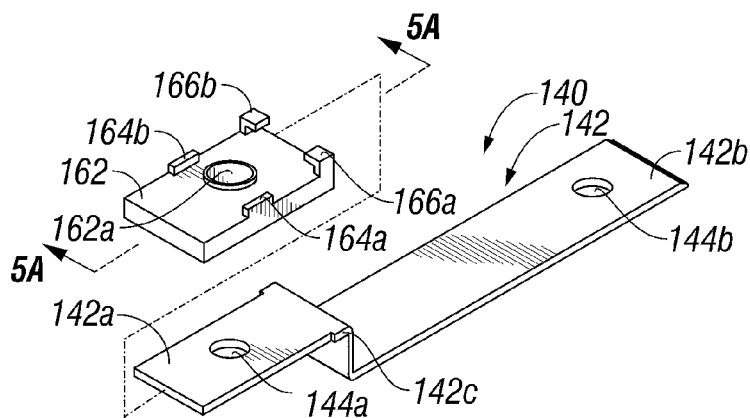
FIG. 5 is an enlarged perspective view of a test strap and spacer of the test terminal connector of FIGS. 1-4.
Figure 5A:
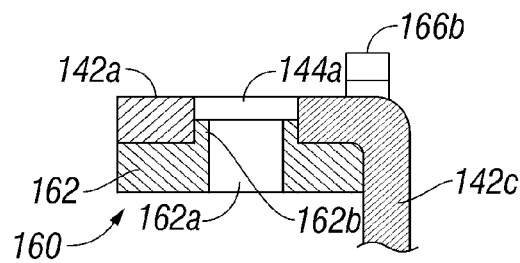
FIG. 5A is a cross-sectional view of the test strap and spacer of FIG. 5 as taken through 5A-5A of FIG. 5.
Figure 6A:
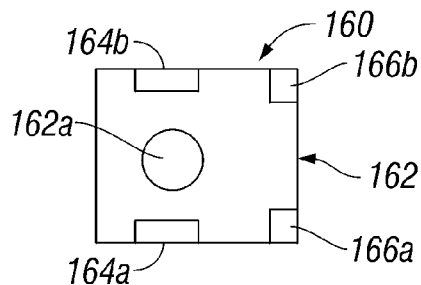
FIGS. 6A-6D are top, bottom, right and left side views, respectively, of the spacer of the test terminal connector of FIGS. 1-5A.
Figure 6B:
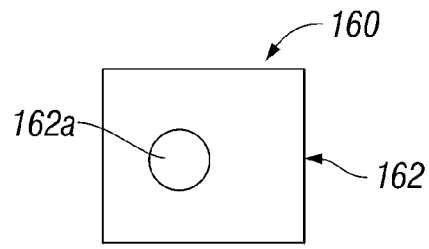
Figure 6C:
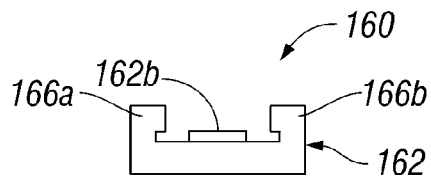
Figure 6D:
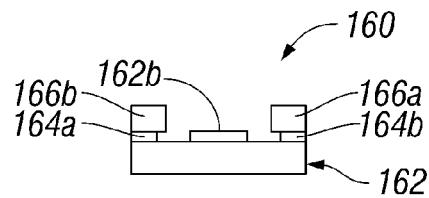

As seen in FIGS. 3-6D, spacer 160 includes a base portion 162 defining an aperture 162a formed therein for receiving mounting bolt 120, and may include a flange, rim or other suitable structure 162b (see FIGS. 3, 4 and 5A) extending from a surface thereof, bounding aperture 162a, and configured for insertion into first aperture 144a of first end 142a of test strap 140. In this manner, spacer nut 138 and mounting bolt 120 are isolated and/or insulated from test strap 140. As seen in FIG. 5A, flange 162b has a height which is at least one of equal to and less than a thickness of first end 142a of test strap 140. In this manner, binding or clamp nut 150 will contact first end 142a of test strap 140 when binding or clamp nut 150 is fully tightened onto mounting bolt 120. Moreover, in one embodiment, a surface of binding or clamp nut 150, that contacts the surface of first end 142a of test strap 140, may overlie or extend over aperture 144a formed in first end 142a of test strap 140 and at least partially over flange 162b of spacer 162.

Spacer 160 may include at least one side wall 164 extending from a side edge or from a top surface of base portion 162 so as to extend along a side of first end 142a of test strap 140. As seen in FIGS. 1-6D, a pair of side walls 164a, 164b is provided which extend from base portion 162 and along opposed sides of first end 142a of test strap 142. Side walls 164a, 164b may be located in substantially alignment with flange 162b of spacer 160 when spacer 160 is supported on first end 142a of test strap 140.

Spacer 160 may further include at least one arm 166 extending from a side edge or from a top surface of base portion 162 so as to extend along a side of first end 142a of test strap 140. As seen in FIGS. 1-6D, a pair of arms 166a, 166b is provided which extend from base portion 162 and along opposed sides of first end 142a of test strap 142. Arms 166a, 166b define a channel or passage through which first end 142a of test strap 140 extends and function to help maintain spacer 160 in engagement with or supported on first end 142a of test strap 140. Arms 166a, 166b may be located in close proximity to goose-neck portion 142c of body portion 142 of test strap 140 when spacer 160 is supported on first end 142a of test strap 140.

In use, terminal connector 100 is electrically connected to a portion of a railway circuit by means of electrical leads "E1, E2" or the like. For example, a first electrical lead "L1" may be connected to mounting bolt 120 at a location between lock nut 124 and spacer nut 128, and a second electrical lead "L2" may be connected to mounting bolt 122 at a location between lock nut 126 and test strap 140 and/or an arrestor "A". Electrical lead "L1" may be insulated or separated from lock nut 124 and spacer nut 128 by washers 130. Electrical lead "L2" may be insulated or separated from test strap 140 by a washer 132.

In operation, over time, as binding or clamp nut 150 is loosened or tightened on mounting bolt 120 to connect/disconnect first electrical lead "L1" to terminal connector 100, a surface of binding nut 150 will repeatedly rub against the surface of first end 142a of test strap 140. Since the materials of construction of binding nut 150 and test strap 140 are the same, the repeated abrasion of binding nut 150 against test strap 140 will not, over time, result in a high resistance contact therebetween and thus no intermittence of the railway circuit and potential unwanted situations.

It is to be understood that while certain forms of this invention have been illustrated and described, it is not limited thereto except insofar as such limitations are included in the following claims and allowable equivalents thereof.

What is claimed is:

1. A spacer, comprising:
   a base portion defiling a single aperture formed therethrough, the base portion including at least a pair of side edges, a rear edge, a front edge and a top surface;
   at least one side wall extending above the top surface of the base portion from each of the pair of side edges of the base portion; and
   at least one arm extending above the top surface of the base portion from each of the pair of side edges of the base portion and from the rear edge of the base portion.

2. The spacer according to claim 1, wherein the spacer is a dielectric spacer.

3. The spacer according to claim 1, wherein each arm is L-shaped and includes a portion spaced a distance above the top surface of the base portion and projecting over the top surface of the base portion.

4. The spacer according to claim 1, wherein the spacer includes a first arm at a first corner of the base portion, a second arm at a second corner of the base portion, where the first arm and second arm are aligned with each other, and the at least one side wall includes two side walls aligned with each other and with the aperture, and wherein the two side walls are spaced an axial distance from the first arm and the second arm.

5. The spacer according to claim 1, further comprising a flange positioned within the aperture and projecting above the top surface of the base portion, wherein the aperture and flange are configured to receive a terminal therethrough.

6. The spacer according to claim 1, wherein the spacer is positioned between a test strap and an electrical lead of a railway circuit.

7. The spacer according to claim 6, wherein a height of a flange positioned within the aperture of the spacer is at least one of equal to and less than a a height of the side walls projecting above the top surface of the base portion.

8. The spacer according to claim 6, wherein the at least one arm is configured to partially extend around the test strap.

9. The spacer according to claim 6, wherein the at least one arm facilitates maintaining continuous contact between the spacer and the test strap.

10. The spacer according to claim 6, wherein the spacer supports a portion of the test strap so that the spacer is interposed between the portion of the test strap and at least one fastening element.

11. A terminal connector, comprising:
    a first terminal and a second terminal;
    a test strap extending between and configured to receive the first terminal and the second terminal; and
    a spacer, including:
       a base portion defining a single aperture formed therethrough and wherein one of the first terminal and the second terminal extends through the single aperture, the base portion including at least a pair of side edges, a rear edge, a front edge and a top surface;
       at least one side wall extending above the top surface of the base portion from each of the pair of side edges of the base portion; and
       at least one arm extending above the top surface of the base portion from each of the pair of side edges of the base portion and from the rear edge of the base portion,
    wherein the test strap extends from the rear edge of the base portion of the spacer such that the side walls and the arms of the spacer are disposed along opposed edges of the test strap.

12. The terminal connector according to claim 11, wherein the terminal connector interconnects electrical leads of a railway circuit.

13. The terminal connector according to claim 11, wherein the test strap is constructed of at least one electrically conductive material.

14. The terminal connector according to claim 11, wherein the test strap is coated with at least one of nickel and nickel alloy.

15. The terminal connector according to claim 11, wherein the test strap includes a goose-neck portion interposed between a first end and a second end thereof, wherein the goose-next portion abuts the rear edge of the spacer, and wherein the first end and the second end of the test strap each define an aperture formed therein.

16. The terminal connector according to claim 11, wherein the first terminal is a first mounting bolt and the second terminal is a second mounting bolt.

17. The terminal connector according to claim 11, wherein the plurality of components include at least one fastening element for connecting the first terminal and the second terminal to the test strap, and wherein the spacer is interposed between the at least one fastening element and the test strap.

18. The terminal connector according to claim 17, wherein the at least one fastening element is constructed from a same material as the test strap.

19. The terminal connector according to claim 17, wherein the at least one fastening element includes at least one nut configured for threaded engagement with a respective mounting bolt.

20. The terminal connector according to claim 17, wherein the at least one fastening element defines a surface that contacts the test strap and extends over an aperture formed in the respective ends of the test strap.

21. The terminal connector according to claim 17, further comprising a mounting block for mounting the at least one fastening element and being configured to support the first terminal, the second terminal, and the test strap.

22. The terminal connector according to claim 21, wherein the spacer is configured to continuously maintain a first end and a second end of the test strap in parallel with a surface of the mounting block.

* * * * *